(12) United States Patent
Chirania et al.

(10) Patent No.: US 7,119,570 B1
(45) Date of Patent: Oct. 10, 2006

(54) METHOD OF MEASURING PERFORMANCE OF A SEMICONDUCTOR DEVICE AND CIRCUIT FOR THE SAME

(75) Inventors: Manoj Chirania, Palo Alto, CA (US); Venu M. Kondapalli, Sunnyvale, CA (US); Martin L. Voogel, Los Altos, CA (US); Philip Costello, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 74 days.

(21) Appl. No.: 10/836,850

(22) Filed: Apr. 30, 2004

(51) Int. Cl.
*G01R 31/26* (2006.01)

(52) U.S. Cl. .................................. 324/765

(58) Field of Classification Search .............. None
See application file for complete search history.

(56) References Cited

U.S. PATENT DOCUMENTS

| | | | |
|---|---|---|---|
| 4,199,984 A * | 4/1980 | Huddart et al. ............ 324/678 |
| 5,056,093 A * | 10/1991 | Whetsel ..................... 714/729 |
| 5,155,432 A * | 10/1992 | Mahoney .................... 324/763 |
| 5,287,481 A * | 2/1994 | Lin ............................. 711/135 |
| 6,075,418 A | 6/2000 | Kingsley et al. |
| 6,219,305 B1 * | 4/2001 | Patrie et al. ................ 324/763 |
| 6,239,621 B1 * | 5/2001 | Milshtein et al. ............ 326/95 |
| 6,891,440 B1 * | 5/2005 | Straub et al. ............... 327/238 |

* cited by examiner

*Primary Examiner*—Jermele Hollington
(74) *Attorney, Agent, or Firm*—Walter D. Fields; Justin Liu

(57) ABSTRACT

A test circuit to test rise delay/fall delay performance on a semiconductor device may comprise a latch to latch data at its input responsive to a clock signal. The latch may source an output signal related to the data latched. A buffer chain may be configured to serially propagate the signal sourced by the latch from the latch output back to the clock input, as the clock signal. A reset/set input of the latch may be configured to receive a reset/set signal from an intermediate node of the buffer chain.

18 Claims, 6 Drawing Sheets

METHOD OF MEASURING PERFORMANCE OF A SEMICONDUCTOR DEVICE AND CIRCUIT FOR THE SAME

FIELD OF THE INVENTION

The present invention is related to testing and, more particularly to testing a rise/fall delay performance of semiconductor product.

BACKGROUND

When producing or grading performance of a semiconductor product, test circuits may assist characterization of the product or identification of process variations that may be associated with the semiconductor fabrication. One parameter that may characterize semiconductor products or indicate a variation in process may include the speed of performance.

Test circuits onboard a semiconductor product may be used to characterize certain parameters of semiconductor product. Oscillators may produce a frequency and provide information about the operating speed of a device. But, in order to obtain more precise information about individual elements of the device or the processes of its fabrication to enable isolation of process variations and effects, information regarding the separate rise and fall delay characteristics of the oscillating signal may be needed. As used herein, a rise delay generally refers to the propagation delay through an element or block when receiving a rising edge (low to high transition) at an input. Similarly, a fall delay generally refers to the propagation delay when receiving a falling edge (high to low transition).

The duty cycle of the signal resulting from the oscillator may provide one avenue for such information. However, measurement of the precise duty cycle may be difficult for a variety of reasons. For example, it may be difficult to make a path from the ring oscillator output to the tester input equal for both rising and falling edges across all process variations. Secondly, testers may not have the capabilities for measuring an accurate duty cycle of a clock. Additionally, the output clock from an oscillator might need to be divided in order to make it slow enough for its frequency to be measured by customary testers. Further, such frequency division circuits could be complicated and cumbersome to implement, especially when trying to maintain certain aspects of the original signal.

BRIEF SUMMARY OF THE INVENTION

In accordance with an embodiment of the present invention, a test circuit may determine the rise delay and/or fall delay characteristic based upon the frequency of a signal produced from the test circuit.

In accordance with an embodiment of the present invention, a method of testing an integrated circuit may comprise triggering a flip-flop to latch a first state and to source a signal representative of the first state. A transition for the signal may be propagated through a buffer chain of the integrated circuit. The flip-flop may then be reset (or set) to latch a second state different from the first state while the signal transition continues propagating through the buffer chain. After propagating the signal transition through the buffer chain, it may then be used to drive and trigger the flip-flop to again latch the first state. The propagating, resetting, and the triggering may be repeated a plurality of times. A performance metric for the circuit may be defined based upon a frequency of signal transitions repeatedly propagated through the flip-flop and the buffer chain.

In another embodiment, a circuit may comprise a latch for latching the state of a signal presented at its input responsive to a clock signal. A buffer chain may be disposed serially between the output of the latch and its clock input, and operable to propagate a signal sourced by the latch to the clock input. An intermediate node of the buffer chain may be configured to source a reset/set signal to reset/set the latch. The buffer chain may comprise a first group of buffers coupled serially between the output of the latch and the intermediate node from which to source the reset/set signal. A second group of buffers of the buffer chain may be coupled serially with the first group and between the intermediate node and the clock input to the latch. In particular embodiments, the buffers may be interconnected in electrical series relationship. In further embodiments, the buffers may be serially interconnected by at least one of, e.g., conductive, capacitive, magnetic, optical, etc. interconnects for signal propagation.

In a particular embodiment, the number of buffers in the first group may be substantially equal to the number of buffers in the second group.

In alternative embodiments, the number of buffers for the first and second groups may be defined for a ratio therebetween dependent on an expected skew between rise delay and fall delay parameters.

In yet a further embodiment, the test circuit may be formed in part of a semiconductor device, and may provide an output frequency useful for grading the semiconductor device or assisting process control during fabrication of semiconductor product.

BRIEF DESCRIPTION OF THE DRAWINGS

Embodiments and features of the present invention will become more apparent from the detailed description and the appended claims, with reference to the accompanying drawings, in which:

DETAILED DESCRIPTION

In the following description, numerous specific details may be set forth to provide an understanding of exemplary embodiments of the present invention. It will be understood, however, that alternative embodiments may comprise sub-combinations of the disclosed examples.

Additionally, readily established circuits and procedures of the exemplary embodiments may be disclosed in simplified form (e.g., simplified block diagrams and/or simplified description) to avoid obscuring an understanding of the embodiments with excessive detail. Likewise, to aid a clear and precise disclosure, description of known processes—for example, triggering, clocking, state machine, programming—may similarly be simplified where persons of ordinary skill in this art can readily understand their structure and operations by way of the present drawings and disclosure. Further, specific embodiments may be described relative to a rise delay test application; it will be understood, however, that alternative embodiments may test for fall delay via inversion of signals and input-output-reset polarities.

Further, as referenced in this disclosure, a buffer may comprise two sequential inverters, e.g., two cascade PMOS and NMOS transistor pairs in series relationship, wherein, e.g., a common drain output of a first pair may drive the gates of the second. For such example case, it would be understood that the one of the pair would be designed to dominate the rise/fall delay characteristic for the buffer.

Figure 1:
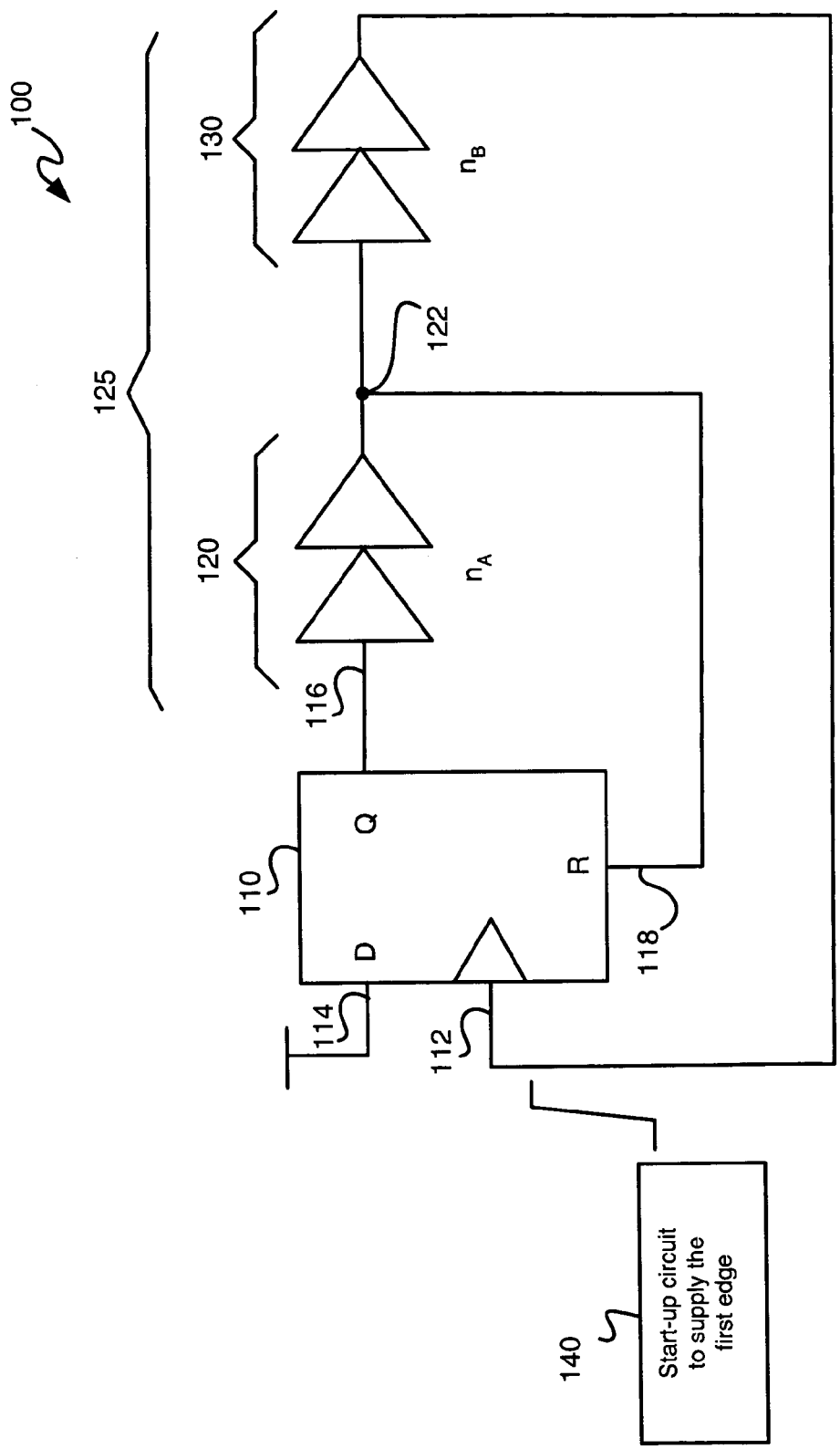
FIG. 1 is a schematic diagram of a test circuit in accordance with an embodiment of the present invention that may be used to test rise delay.

Referencing FIG. 1, a test circuit 100 to determine rise delay performance for buffers of an integrated circuit may comprise flip-flop 110 in electrical series relationship with a loop-back buffer chain 125. The elements together may be driven to act collectively as a type of ring oscillator. Buffer chain 125 may comprise first 120 and second 130 groups of buffers. The first group of buffers 120 may receive the output of flip-flop 110 and propagate a signal to reset point 122. Reset point 122 may be described alternatively herein as an intermediate node of the buffer chain. The second group of buffers 130 may further propagate the signal from reset point 122 to clock input 112 of flip-flop 110. The data input 114 of flip-flop 110 may be biased with a high level such as VDD.

In a particular embodiment, start-up circuit 140 may (e.g., temporarily) drive the clock input 112 to enable flip-flop 110 to initially toggle and latch an active state per the level presented at data input 114. Once the start-up circuit has stimulated an initial clock edge, it may, thereafter, be simplified or assumed in a non-participating role.

Upon toggling and latching an active (high) level, flip-flop 110 may drive output 116 with a rising edge—i.e., a transition from a low state to a high state. The transition may be received at the input of buffer chain 125 for propagation. First buffer group 120 may propagate the transition toward the intermediate node or reset point 122. Reset point 122 may serve as a tap from the buffer chain to source a reset signal for driving the reset input 118 of flip-flop 110. The sourced reset signal may cause flip-flop 110 to clear its state. Accordingly, output 116 may transition to restore the reset (low) condition.

While this reset operation is being performed, the initial leading edge may further propagate beyond reset point 122 and into the second group of buffers 130 of buffer chain 125. Eventually, the leading edge may propagate through a final buffer to drive the clock input 112 of flip-flop 110. Having previously been cleared by the reset signal (as sourced by midpoint 122), latch 110 may thus respond to the leading edge circulated by buffer chain 125 to again latch an active (high) state. Thus, the rising edge propagated from the end of the chain may initiate a new edge for beginning another cycle of an oscillating signal. Once enabled and triggered, test circuit 100 may repetitively circulate sequential rising edge transitions until the oscillation is disabled.

Assuming a propagation delay through flip-flop 110 of a nominal magnitude relative to the overall propagation delay through the combined first and second groups of buffers 120, 130 that define buffer chain 125, the periodicity $T_{osc}$ of oscillation may be approximated as being equal to the number of buffers within the chain ($n_A + n_B$) times the average rise delay associated with the buffers ($\tau_r$).

$$T_{osc} = \tau_r(n_A + n_B)$$

Figure 2:
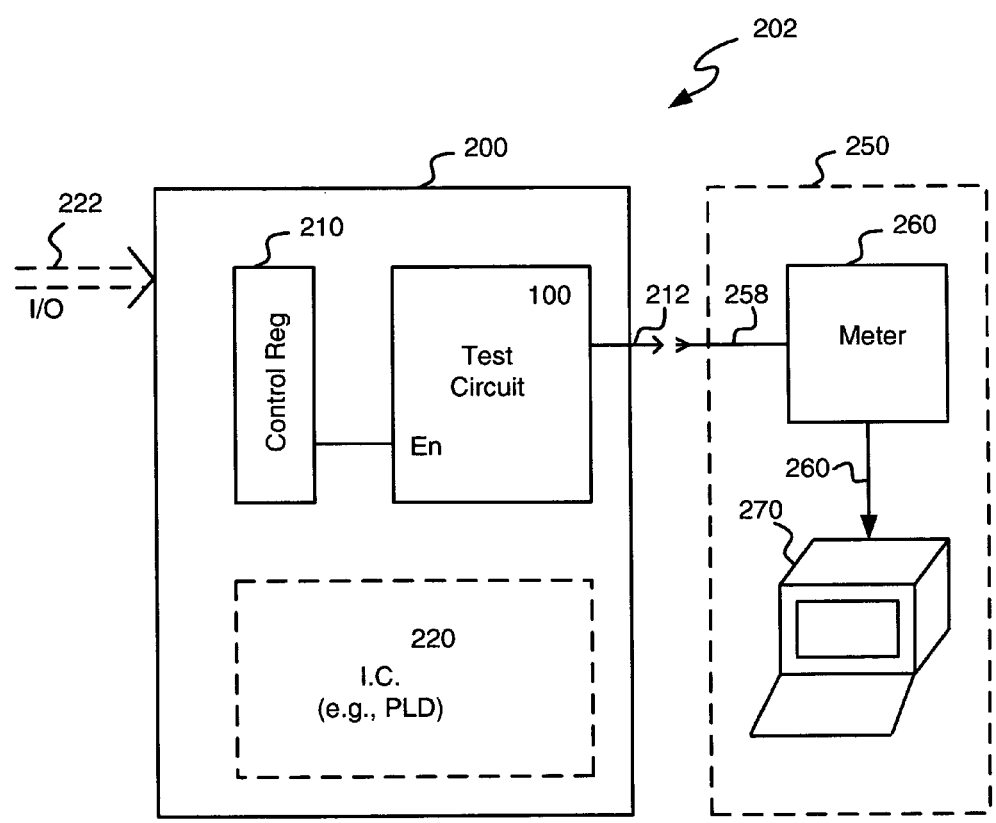
FIG. 2 is a simplified block diagram of a test system in accordance with a further embodiment of the present invention showing a semiconductor device comprising a test circuit coupled to test equipment to determine a performance metric.

In a particular embodiment, referencing FIG. 2, test circuit 100 for determining rise delay characteristics may be incorporated within semiconductor device 200. Control registers 210 embedded in semiconductor device 200 may be selectively programmed to enable operation of test circuit 100. In further embodiments, it may be understood that semiconductor device 200 might comprise other functional provisions. For example, in some cases, semiconductor device 200 may comprise programmable logic, programmable resources 220, etc. and test circuitry 100 may be embedded within the device to assist characterization of its resources. Control registers 210 may be configured from configuration memory of the programmable logic device or through other alternative I/O interfacings 222 to semiconductor device 200.

When enabled, test circuit 100 may begin oscillating as described previously relative to FIG. 1. The oscillating signal may be presented to a test pin or interface 212. Test equipment 250 (such as a frequency meter) may comprise an input 258 for receiving the signal from interface 212. Receiving the output signal, meter 260 may determine a frequency of oscillation ($F_{OSC}$).

Data representative of the frequency determined may be forwarded to process/collection module 270 (such as a computer, test data bank, pass/fail system, process controller, etc.). The frequency determined by meter 260 may be understood to be related to a performance metric of semiconductor device 200. For example, assuming the delay of the buffers to be substantially greater than that of flip-flop 110, buffer rise delay performance may be determined by the following equation:

$$F_{osc} = [1/(n_A + n_B)\tau_r]; \text{ therefore}$$

$$\tau_r = [1/F_{osc}(n_A + n_B)]$$

In further embodiments, this information might further be used to define other metric(s) of semiconductor device 200.

For example, the buffers of the ring oscillator may each comprise a pull-up or pull-down transistor. The pull-up transistor may comprise limiting parameters such as, for example, threshold voltage, output resistance, gate length, body doping concentration, etc., which may each be understood to impact the drive capability of the buffer. This output drive capability of the buffer, in cooperation with the input capacitance of a subsequent device, for example, may thus limit the rise delay performance within the test circuit. Accordingly, the rise delay performance of the rise delay test circuit may, in accordance with some embodiments, be used to predict or speculate as to the parameters (cut-off frequency, rise delay) for pull-up transistors across the overall semiconductor device. Through appropriate modeling and/or extrapolation, therefore, a performance metric of the semiconductor device may be defined with relationship to the measured or determined results from the test circuit 100 of semiconductor device 200.

In further embodiments, the determined rise delay may be used to grade performance of semiconductor device 200; or, alternatively, data thereof may be fed back to a semiconductor fabrication system and may be used to control a process associated with, for example, forming the pull-up transistor.

Figure 3:
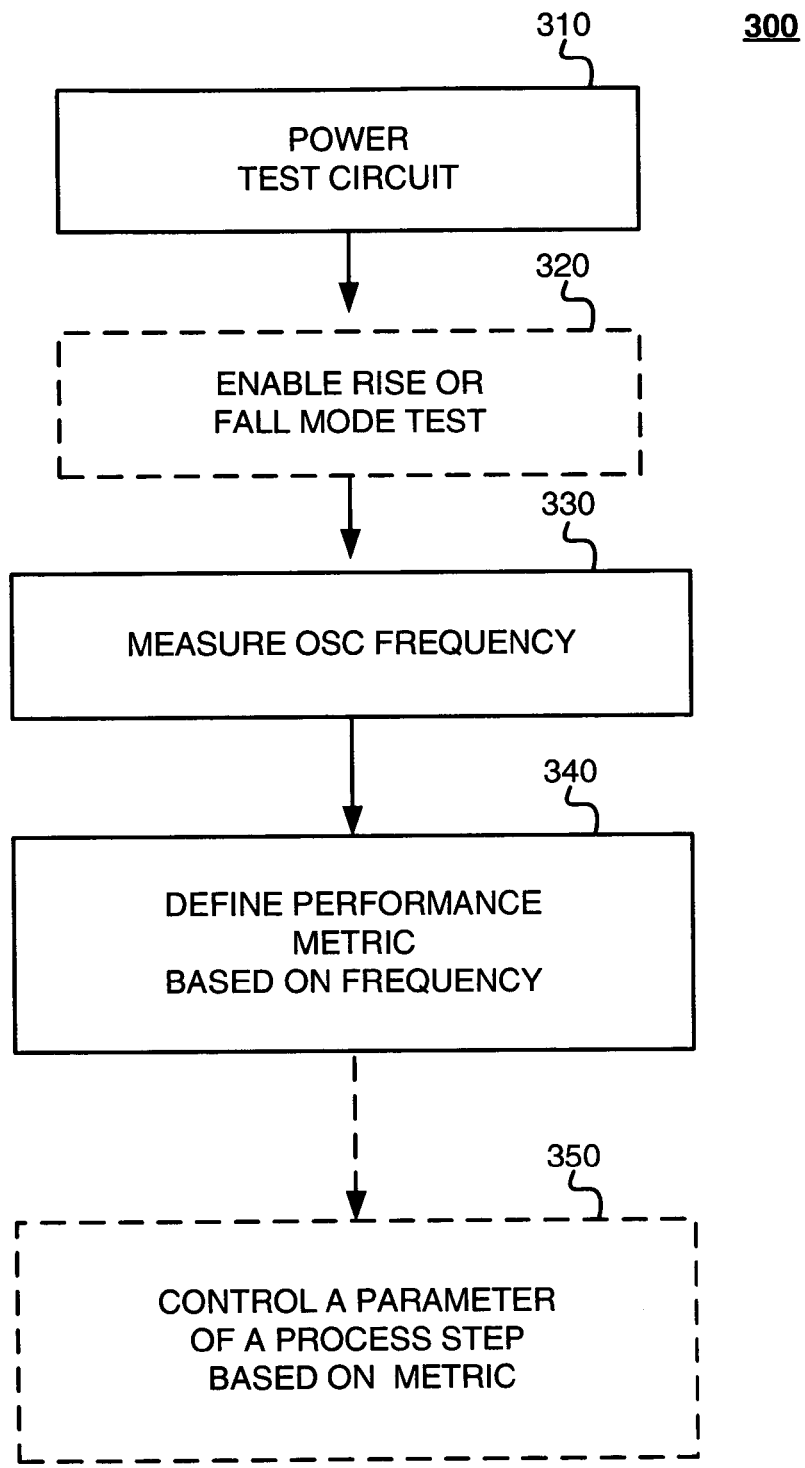
FIG. 3 is a simplified flow chart representative of a method of testing in accordance with an embodiment of the present invention.
Figure 4:
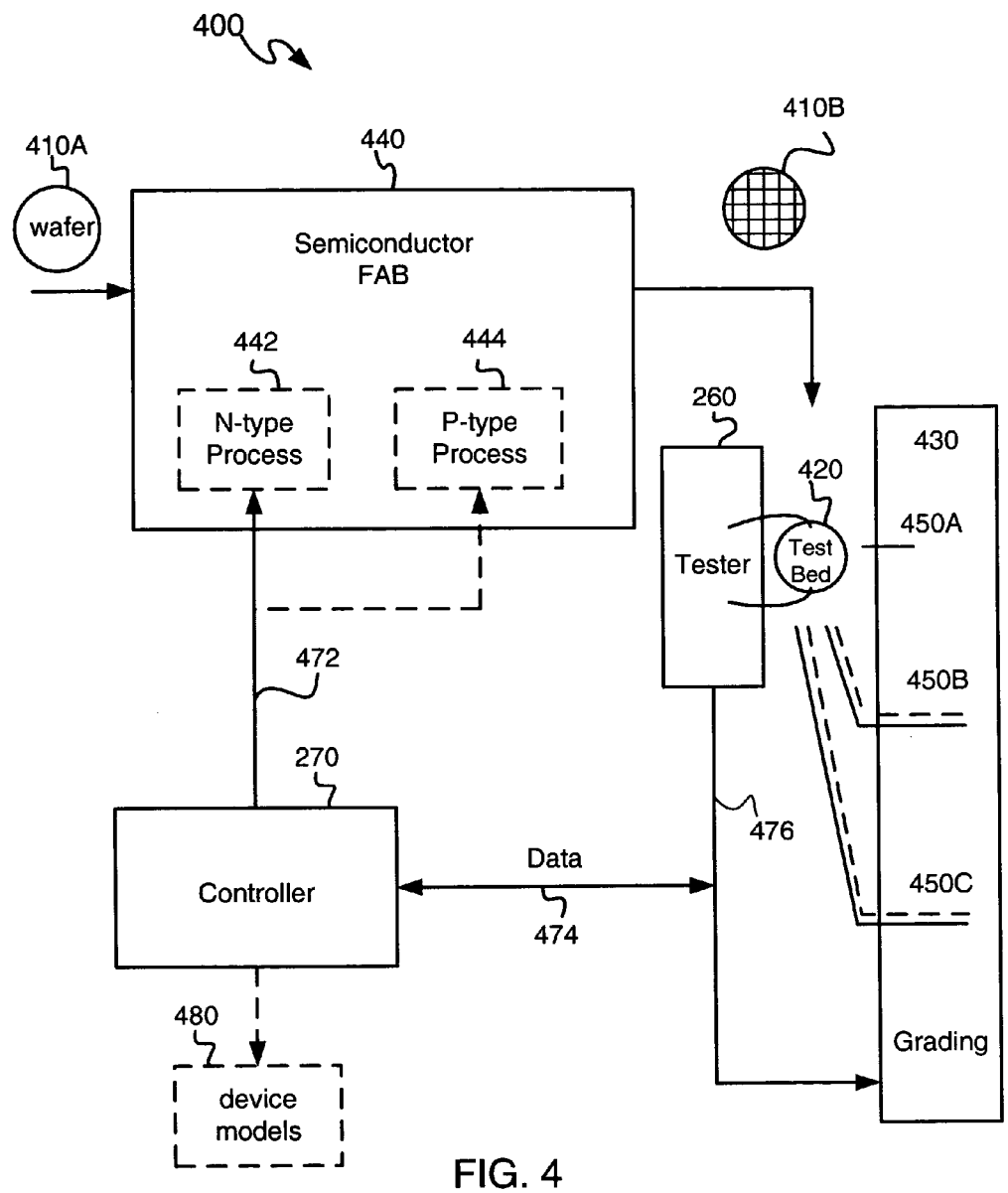
FIG. 4 is a simplified block diagram representative of a system to fabricate semiconductor devices in accordance with a further embodiment of the present invention, and showing semiconductor product produced from a semiconductor FAB and which may be routed to a test station for testing to assist product grading and/or process control and/or software modeling.

Further referencing FIGS. 3 and 4, a semiconductor fabrication system 400, in accordance with another embodiment of the present invention, may comprise a semiconductor FAB 440 that receives input wafers 410A and processes the wafers using a plurality of separate processes, such as N-type process(es) 442 and P-type process(es) 444 to produce semiconductor product 410B. Testbed 420 (or, alternatively, test station) may receive fabricated product and probe/monitor test circuits thereof with equipment, such as meter 260. A method of testing 300 (FIG. 3), in accordance with an embodiment of the present invention, may act upon the test circuitry of semiconductor product 410B to initiate performance testing.

Initially, power may be applied (step 310) to the test circuit such as test circuitry disclosed previously relative to FIG. 1. Once enabled, the test circuit may oscillate with a frequency dependent upon the rise delay (or fall delay) of devices in the "ring oscillator" circuit (step 320). Meter 260 may measure (step 330) an oscillation frequency $F_{out}$, which may be related to the rise delay (fall delay) performance of circuit elements within the test circuit. Data from the test meter 260 may then be forwarded (e.g., along data bus 476) to input 474 of controller 270. In further embodiments, controller 270 may comprise known test screening and sorting tools or data collection banks for recording the test data and/or triggering other downstream sorting processes of the fabrication system 400.

In a particular embodiment, the resulting test data may be used to define a performance (step 340) of the semiconductor product 410B. Based upon the determined frequency of oscillation sourced from the test circuitry, the resulting product may be characterized. For example, the performance metric may define an output resistance of pull-up transistors that may be inherent within the buffers associated with the rise delay test ring oscillator circuit. Or, the performance metric may represent a threshold characteristic that would be related to the drive capabilities of an output buffer. And/or, perhaps a power factor of a semiconductor product may be impacted, etc. Each of these singly or together could be factored into a relationship with results obtained from the test circuit, which performance metrics might then be used for extrapolation and characterization for other circuitry of the semiconductor product.

In a further embodiment, controller 270, further referencing FIGS. 3 and 4, may grade product at a grading station 430 based upon the determined test data. The grading station, e.g., could comprise a wafer handler, die handler, chip handler, etc., that could sort tested product to one of a plurality of bins represented by notations 450A, 450B, and 450C. In this particular example, therefore, the product handler may position the tested product into one of a plurality of bins based upon the performance metric determined and processed by controller 270 and/or dependent upon the previously measured frequency of oscillation.

In a further embodiment, it may be understood that test station may interact with a plurality of different test circuits across a given semiconductor wafer 410B for testing different die across the wafer. Data, which may be in the form of a database, may then be forwarded to controller 270 for characterizing one or more of the die across the semiconductor product 410B. Furthermore, the die might then be separately graded, diced, and then sorted into different grading bins based upon the data previously retained. Thus, although shown as having product grading bins represented along a sorting station 430 and characterized previously by way of a wafer handler, it will be understood that alternative embodiments may employ die handlers, integrated circuit handlers, or chip handlers that would still be operable for sorting product based upon the oscillating frequencies previously obtained from a test circuit associated therewith.

In yet a further embodiment, the controller 270 may process the resulting test data from one or a plurality of different semiconductor product and generate feedback 472 control signals to control parameters within the semiconductor FAB 440, or otherwise modify and improve the manufacturing process. For example, the feedback data may be used to control a parameter of a process step (step 350) based upon the previously determined performance metric. As another example, in a particular case, the feedback may be used to control the doping density of N-type dopant within an implant process, as may be used for the fabrication of semiconductor product. In a further embodiment, it might be used to control the amount of P-type diffusion or the annealing of P-type dopant of a P-type process 444 for the production of integrated circuits. As yet a further example, the test data may indicate problems in the metal resistance or capacitance values that may be corrected through adjusting the process. In general, the feedback data may be used to make modifications to any aspect of the fabrication process. In this fashion, the frequency of oscillation provided by the rise delay (fall delay) ring oscillator test circuit (for example, 100 of FIG. 1) might be used to generate control data for assisting or refining processes of a semiconductor fabrication system.

In further embodiments, the controller 270 may process the test data and generate feedback for producing more accurate device models 480. For instance, hspice or other simulation or software models may be modified based on the test data. In this way, simulation results using such models will be more accurate, and will more closely reflect the actual performance of the fabricated semiconductor devices.

Figure 5:
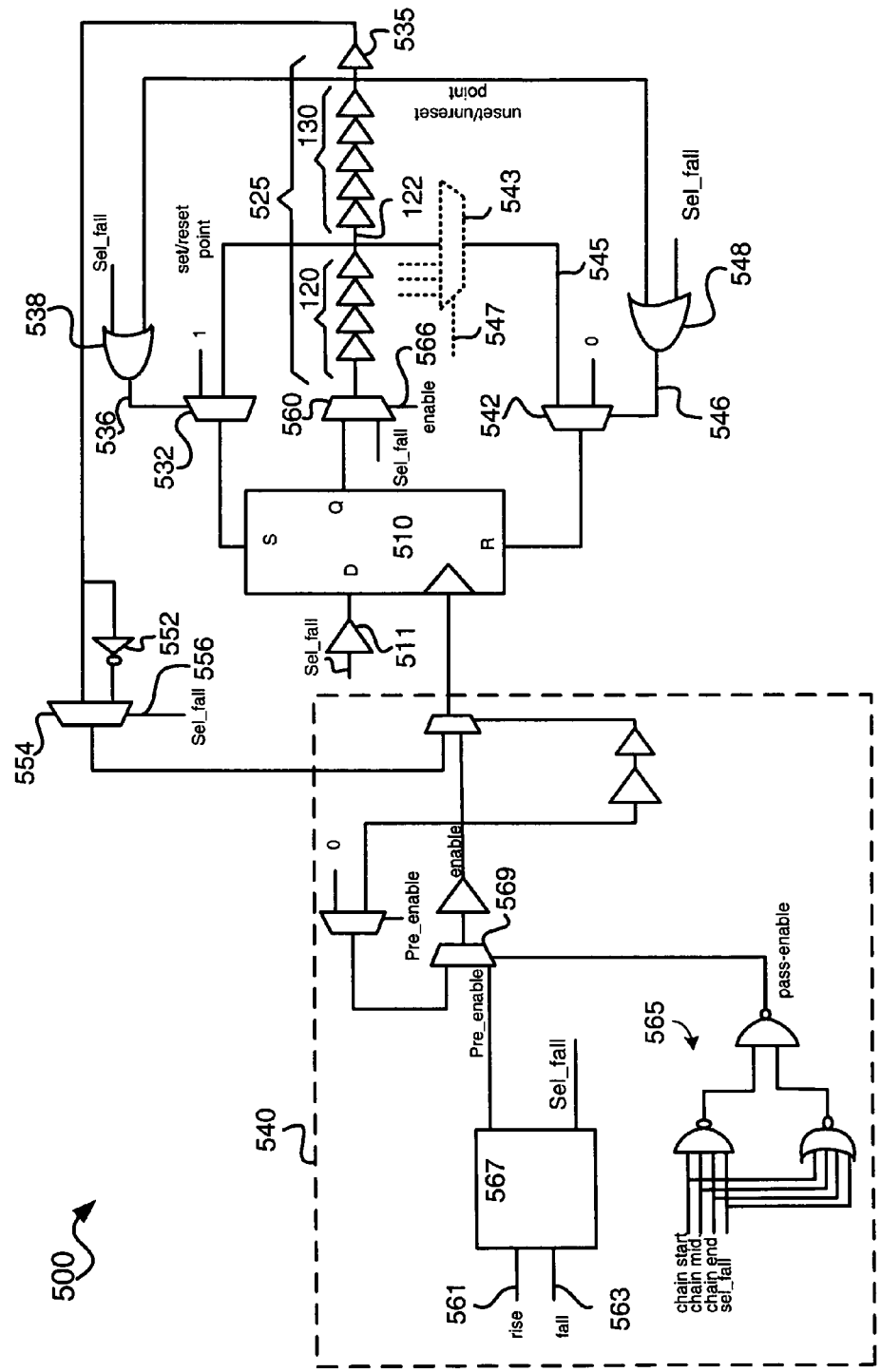
FIG. 5 is a schematic diagram in accordance with another embodiment of the present invention, illustrating a ring oscillator test circuit for rise delay or fall delay testing.

In accordance with another embodiment of the present invention, referencing FIG. 5 relative to FIG. 1, it may be understood that a fall delay test circuit may be configured with some modifications to the rise delay test circuit as previously described relative to FIG. 1.

In test circuit 500 of this embodiment, buffer chain 525 may comprise a first sequential series of buffers 120 in serial arrangement with a second group of sequential buffers 130. It will be understood that these buffers may be representative of non-inverting circuit elements.

In one particular example, the buffers may comprise two sequential inverters, e.g., two cascade PMOS and NMOS transistor pairs in series relationship, wherein the common drain output of the first pair may drive the gates of the second. For this specific case, the second pair of the series sequence would be designed to dominate the overall rise/fall delay characteristic for the buffer.

Continuing with reference to FIG. 5, again, intermediate node 122 may be tapped to source a control signal for propagation to a set/reset input of D-flip-flop 510, dependent upon the configuration mode of the test circuit—e.g., a rise delay test mode or a fall delay test mode.

In the rise delay test mode, test circuit 500 may be understood to operate similarly to the embodiment described previously relative to FIG. 1. In the fall delay test mode, on the other hand, it will be understood that the test circuit 500 may be configured to measure the fall delay by changing the reset signal to a set signal and by connecting the D input of the flip-flop to a low-voltage source. Additionally, an inverter 552 may be selectively positioned between the end of the buffer chain and the clock input to the flip-flop 510, and the signal sourced by the intermediate node 122 may drive the set input (which may be active low) of D-flip-flop 510, instead of the reset input.

Further referencing FIG. 5, configurable switch 532 may allow coupling of either a high level or, alternatively, the signal of intermediate node 122 to drive the set input of flip-flop 510. Logic 538 may be used to select the configuration of switch 532 dependent on each of the "sel_fall" control signal (sourced from controller 540) and the "unset/unreset" control signal (sourced from near the end of the buffer chain). Note, the "unset/unreset" control signal may be understood to de-activate either one of the set or reset signals if it is being applied to flip-flop 510. By clearing these signals, the D-flip-flop 510 may then be available for receiving and acting upon the next clock edge when delivered to its clock input.

In the case of the fall delay test mode, the falling edge from buffer 535 may drive the clock input of D-flip-flop 510 via inverter 552, which may be selectably configured in series with the feedback path dependent upon the configuration of switch 554. This switch 554 may be controlled via "sel_fall" control signal on line 556.

In contrast, for the rise delay test mode, a rising edge from the buffer chain may be advanced directly to the clock input of D-flip-flop 510 via an alternative configuration of switch 554. Likewise, switch 542 may be configured to source the reset signal from intermediate node 122 back to the reset input of D-flip-flop 510, as may be gated by logic 548 dependent upon the "sel_fall" and the "unset/unreset" control signals.

Control logic 540 may generate "sel_fall" control signal to drive control line 556 of switch 554, as well as logic 538 associated with the set clear path and logic 548 associated with the reset clear path. In addition, the logic (high or low) level of the "sel_fall" control signal may also be used to source and drive the D input of the flip-flop. In a particular case, the "sel_fall" control signal may drive the data input via buffer/inverter 511.

In a further embodiment, and further referencing FIG. 5, control circuitry 540 may comprise logic 567 operable to generate a pre_enable signal whenever the oscillator is to be used. In this embodiment, control signals "rise" and "fall" at control inputs 561, 563 may be processed by logic 567 to source the pre_enable signal with an active level when either one of the "rise" or "fall" inputs is high. Further portions of logic 567 may generate an operating mode signal "sel_fall" dependent on the states of the inputs "rise" and "fall". For example, the logic could generate mode signal "sel_fall" with an active level when the control signal "rise" is low and the control signal "fall" is high.

Multiplexer 569 may be configured to select the "pre_enable" as the "enable" signal. The configuration of the multiplexer may be based upon control signal "pass_enable." When the pass_enable signal is high, the multiplexer may select the pre_enable signal to source the enable signal and enable the test circuit. In this embodiment, the "pass_enable" control signal may indicate when the oscillator is in a proper condition for beginning oscillation. Because the rise or fall control signals may go high at any time, logic 565 may be operable to assure that the oscillator is in a proper state before beginning oscillation. Different nodes of the buffer chain, such as the start, middle and end of the buffer chain, may be tapped for sourcing status signals (e.g., chain_start, chain_mid, chain_end on FIG. 5). These status signals, in combination with "sel_fall" signal, may be used to determine when to enable multiplexer 569 and forward a clock edge to initiate oscillation.

In one example, a fall mode may be selected by defining the sel_fall signal high. The buffer chain may thus need to be initialized high to enable propagation of a falling edge. The logic 565 may verify that the start, middle and end nodes of the buffer chain have been set high before allowing an initiating clock edge to be delivered to the clock input of the flip-flop. When these nodes have been determined to be properly set, the pass_enable signal may transition high to allow the pre_enable signal to drive the flip-flop and start the oscillations.

Finally, a switch 560 may be inserted serially between the flip-flop 510 and the buffer chain 525. One input line of switch 560 may be coupled to the output of flip-flop 510 while the other may be driven by a control signal "sel_fall." The configuration of switch 560 may be driven by an "enable" control signal, which can also be generated by controller 540 for enabling appropriate initialization configurations for buffer chain 525. With appropriate initializations, it may function to propagate either a rising-edge or a falling-edge based upon the rise delay or fall delay test mode. Controller 540, thus, may be operable dependent on the rise and fall mode select signals at inputs 561 and 563 for generating the "sel_fall" control signal. Similarly, it may generate the initial transition to the ring oscillator after establishing the initialization configuration of the chain buffer 525 (via switch 560 and the control signal "sel_fall" and "enable"). Thereafter, the control logic 560 may be assumed removed from operation of the ring oscillator.

In a particular embodiment of the present invention, referencing FIGS. 1 and 5, the position of intermediate node 122 from which to source the reset/set signal may be selected to offer the test circuit a given reliability. The tap point from which to source the set or reset signal may be designed dependent upon an expected ratio between the output drive capability of P-MOS devices relative to N-MOS devices, e.g., an anticipated ratio between the rise and fall delays within the buffers.

Where the rise and fall delays may be anticipated to be equal to each other, the intermediate node 122 may be designed for tapping the middle of the buffer chain. In this embodiment, the number $n_A$ of buffers for the first group 120 may be designed to be equal to the number $n_B$ of buffers for the second group 130. For other expected rise-to-fall ratios, alternative positions may be designed for the tap point.

In one case, where the fall delay may be expected to be much faster than the rise delay, it may be problematic to design the reset point close to the flip-flop (where $n_A$ of buffers for the first group is small compared to the number $n_B$ for the second group). With this selection, a timing gap between the rising edge and falling edge relative to the subsequent falling edge caused by the reset signal may be compromised—i.e., the falling edge resulting from the reset might catch up with the original rising edge before the rising edge reaches the end of the chain. If the falling edge should catch-up with the rising edge, the ring oscillator might stop oscillating. Accordingly, in a particular embodiment of the present invention, the intermediate node 122 may be positioned further to one end of the buffer chain than the other so as to allow a larger gap between the edges, and to improve reliability for operation of the test circuit.

In another case, the circuitry may be expected to perform with a rise delay faster than the fall delay. It may be problematic to operate the circuit should the reset point have been positioned close to the end of the chain, wherein the number $n_B$ for the second group 130 would be small compared to the $n_A$ of buffers for the first group 120. If the tap were positioned close to the end of the buffer chain under these conditions, the gap between the falling edge caused by the reset signal and the next rising edge caused by a re-trigger may be compromised. Thus, the newly triggered rising-edge might risk catching-up with the falling-edge before it reaches the end of the buffer chain. The tap for the intermediate node 122 may thus seem to call for a placement closer to the beginning of the chain so as to provide a larger gap between the falling-edge and next rising-edge so that the circuit may sustain oscillator operation.

To further illustrate this potential type of problem, by way of example, the rise delay may be assumed to be two times faster than the fall delay. If the reset point is assumed to tap a position near the beginning of the chain, then a rising edge may reach the end of the chain to start the next rising edge at a time T, at which time the falling edge (produced by the reset) may have reached the halfway point within the buffer chain. Thereafter, at a time 2T, the new rising-edge might then catch the falling edge before it reaches the end of the chain. Therefore, the circuit might risk inoperability. For such cases, it may be seen, therefore, that there may be a limit in test operability.

In more specific terms, when a given skew may be anticipated between the rise delay and fall delay characteristics to a given circuit design, a particular tap placement for the intermediate node may be determined so as to afford reliable test circuit operations.

In other embodiments, a mathematical relationship may be used to define a tap placement for the intermediate node. For example, if a skew of 38 percent may be anticipated, the intermediate node may be positioned at a tap point of about 38 percent into the buffer chain. The following equations may further guide the selection of tap position for intermediate node.

If the original gap ($t_{s0}$) between the rising and falling edge may be defined as $t_{s0}$=Gap Original Then the gap resulting after n stages ($t_{sn}$) may be defined by $t_{sn}=t_{s0}-n\cdot(t_r-t_f)$; where n=number of stages in the chain,
$t_r$=rise delay per stage, and
$t_f$=fall delay per stage.

The number of stages before the reset point may be defined by $n_A = y \cdot n$  $0 \leq y \leq 1$ Skew in either direction can be defined by the variable x=skew tolerable in each direction When the fall delay is faster than the rise delay, it represented by $t_f = x \cdot t_r$  $0 \leq x \leq 1$ Alternatively, when the rise delay is faster than the lay, it may be represented by $t_f = \frac{1}{x} \cdot t_r$
$0 \leq x \leq 1$ For the first case, when the fall delay is faster than the delay, the gap between edges at the end of the chain may be defined by the equation $t_{sn1} = y \cdot t_f - (1-y) \cdot n \cdot (t_r - t_f)$ For the second case, when the rise delay is faster than the fall delay, the gap between edges at the end of the chain may be defined by the equation $$t_{sn2} = \left[\frac{(1-y)\cdot n \cdot t_r}{t_f}\right]\cdot t_r - \left[n - \frac{(1-y)\cdot n \cdot t_r}{t_f}\right]\cdot (t_f - t_r)$$

For equal robustness for both cased, the circuit may be designed for the following relationship $t_{sn1} = t_{sn2}$ Substituting the above equations for $t_{sn1}$ and $t_{sn2}$ and solving for y, the tap position within the buffer chain may be defined relative to the expected skew between the rise and fall delays by equation as follows $$y = 1.5 - \frac{x}{2} - \frac{1}{2\cdot x}$$

Figure 6:
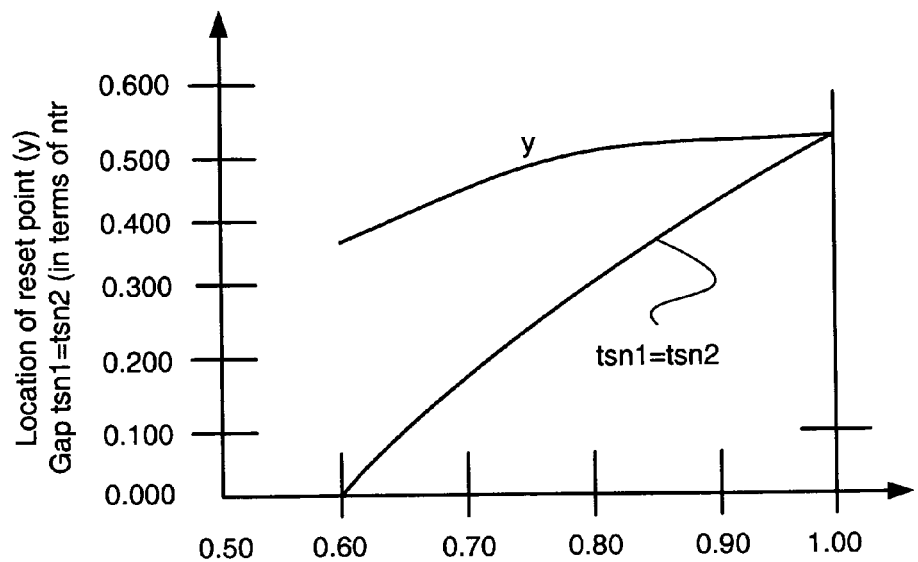
FIG. 6 is a graph which may be used to guide design of a test circuit in accordance with an embodiment of the present invention.

From this equation, general relationships may be predicted for gap performance that may result from various expected skew and associated tap placements. These have been calculated in TABLE 1 below and may be represented by the graphs of FIG. 6.

TABLE 1

| x | y | Tsn1 = Tsn2 (in terms of n*tr) |
|---|---|---|
| 1.00 | 0.500 | 0.50 |
| 0.98 | 0.500 | 0.48 |
| 0.96 | 0.499 | 0.46 |
| 0.94 | 0.498 | 0.44 |
| 0.92 | 0.497 | 0.42 |
| 0.90 | 0.494 | 0.39 |
| 0.88 | 0.492 | 0.37 |
| 0.86 | 0.489 | 0.35 |
| 0.84 | 0.485 | 0.32 |
| 0.82 | 0.480 | 0.30 |
| 0.80 | 0.475 | 0.28 |
| 0.78 | 0.469 | 0.25 |
| 0.76 | 0.462 | 0.22 |
| 0.74 | 0.454 | 0.19 |
| 0.72 | 0.446 | 0.17 |
| 0.70 | 0.436 | 0.14 |
| 0.68 | 0.425 | 0.10 |
| 0.66 | 0.412 | 0.07 |
| 0.64 | 0.399 | 0.04 |
| 0.62 | 0.384 | 0.00 |
| 0.60 | 0.367 | −0.03 |
| 0.58 | 0.348 | −0.07 |

Figure 7:
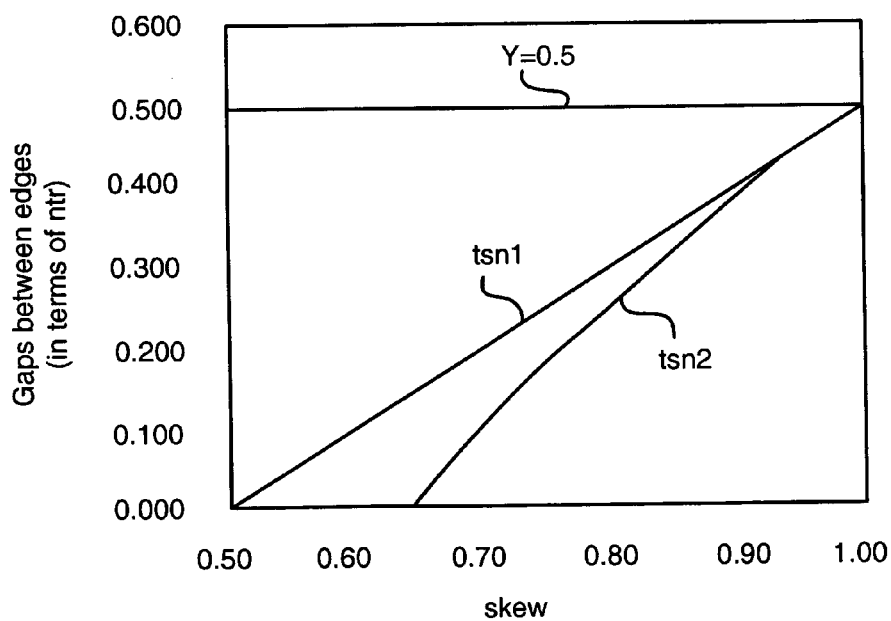
FIG. 7 is a graph useful to gain an understanding of a particular embodiment of the present invention, presenting gap limits for different rise and fall delay skew relationships per a test circuit design with a middle tap location.

To illustrate how the adjustment of the tap placement can aid circuit reliability, gap performance per the equated solutions of TABLE 1 may be compared to the relative gap performances that would otherwise result for a design comprising a tap placed at the middle of the buffer chain as presented in TABLE 2 below. This may be further illustrated by the graphs of FIG. 7.

TABLE 2

| x | y | Tsn1 (in terms of n*tr) | Tsn2 (in terms of n*tr) |
|---|---|---|---|
| 1.00 | 0.500 | 0.50 | 0.50 |
| 0.96 | 0.500 | 0.46 | 0.46 |
| 0.92 | 0.500 | 0.42 | 0.41 |
| 0.88 | 0.500 | 0.38 | 0.36 |
| 0.84 | 0.500 | 0.34 | 0.31 |
| 0.80 | 0.500 | 0.30 | 0.25 |
| 0.76 | 0.500 | 0.26 | 0.18 |
| 0.72 | 0.500 | 0.22 | 0.11 |
| 0.67 | 0.500 | 0.17 | 0.00 |
| 0.64 | 0.500 | 0.14 | −0.06 |
| 0.60 | 0.500 | 0.10 | −0.17 |
| 0.56 | 0.500 | 0.06 | −0.29 |
| 0.52 | 0.500 | 0.02 | −0.42 |
| 0.50 | 0.500 | 0.00 | −0.50 |

In an optional embodiment, further referencing FIG. 5, multiplexer 543 or switching circuit may be incorporated between multiple possible tap positions along the buffer chain and the tap feedback path 545. This tap selection multiplexer may be operable to select one of multiple possible tap positions from which to source the set/reset signal. In such embodiment, a program controller may drive tap select control lines 547 of the multiplexer to configure it for a given tap selection. By this programmable selectability for the tap position, this test circuit embodiment may be adaptable to a broad range of skew relationships.

While certain exemplary features of the embodiments of the invention have been illustrated and described herein, many modifications, substitutions, changes and equivalents may now occur to those skilled in the art. It is, therefore, to be understood that the appended claims are intended to cover all such embodiments and changes as fall within the spirit of the invention.

The invention claimed is:

1. A circuit comprising:
a latch to latch data at its input responsive to a clock signal and to source an output signal related to the data latched;
the latch further comprising a reset/set input to receive a reset/set signal to clear/set the data latched; and
a buffer chain disposed serially between an output of the latch and a clock input of the latch and operable to propagate the signal sourced by the latch;
the buffer chain comprising:
an intermediate node to source a reset/set signal to the reset/set input of the latch;
a first group of buffers coupled in series between the output of the latch and the intermediate node; and
a second group of buffers is coupled in series with the first group of buffers and disposed between the intermediate node and the clock input of the latch.

2. The circuit of claim 1, in which the buffers of the first and second groups comprise non-inverting buffers.

3. The circuit of claim 2, in which the latch comprises a D-flip-flop, the data input of the D-flip-flop coupled to a data source to source a state, the latch to latch the state responsive to a transition at the clock input when the reset/set inputs of the D-flip-flop are non-active.

4. The circuit of claim 2 in which the number of buffers in the first group is substantially equal to the number of buffers in the second group.

5. The circuit of claim 2, in which
the latch comprises a delay characteristic between a transition received at the reset/set input and presentment of a cleared/set state at its output; and
the second group of buffers comprise a propagation delay of duration substantially greater than the delay characteristic.

6. The circuit of claim 1, further comprising:
means for pre-configuring the latch based on a test mode signal to source one of a falling edge or a rising edge to the buffer chain; and
means for enabling and initiating signal oscillation through a ring oscillator defined at least in part by the latch and buffer chain.

7. The circuit of claim 1, in which
the buffers comprise an expected ratio for a rise delay drive capability relative to a fall delay drive capability; and
the number of buffers for the second/first group of buffers is related to the expected ratio and the number of buffers for the first/second group of buffers.

8. The circuit of claim 1, further comprising:
a tester to determine a frequency of oscillation of the latch and the buffer chain; and
process controller configured to control a process of semiconductor fabrication in response to the frequency determined by the tester.

9. The circuit of claim 8, the tester further comprising a frequency counter to measure the frequency of oscillation of the latch and the buffer chain.

10. The circuit of claim 9, in which the process controller controls at least one of an n-type process and a p-type process of a fabrication system associated with producing circuit elements related to those of the buffer chain.

11. The circuit of claim 9, in which the tester further comprises a probe coupled to an oscillation circuit defined at least in part by the latch and the buffer chain, the probe propagating a signal of the oscillation circuit to the frequency counter.

12. The circuit of claim 1, further comprising:
a multiplexer coupled between the buffer chain and the reset/set input of the latch;
the multiplexer configured to select one of a plurality of intermediate nodes of the buffer chain to source the reset/set signal to the reset/set input of the latch.

13. A circuit comprising:
a latch to latch data at its input responsive to a clock signal and to source an output signal related to the data latched;
the latch further comprising a reset/set input to receive a reset/set signal to clear/set the data latched;
a buffer chain disposed serially between an output of the latch and a clock input of the latch and operable to propagate the signal sourced by the latch;
the buffer chain comprising:
an intermediate node to source a reset/set signal to the reset/set input of the latch;
a first group of buffers coupled in series between the output of the latch and the intermediate node; and
a second group of buffers coupled in series with the first group and disposed between the intermediate node and the clock input of the latch;
switching circuitry selectably operable to propagate the reset/set signal to one of the reset and set inputs of the latch dependent on a control signal; and
an inverter selectably and removeably operable in series between the buffer chain and the clock input dependent on the control signal.

14. The circuit of claim 13, further comprising control circuitry to define the control signal for configuring the switching circuitry, and the selection of the inverter for series operation dependent on a test mode signal.

15. The circuit of claim 14, the control circuitry further to source a start-up transition for the clock signal at the clock input of the latch.

16. A circuit comprising:
a latch to latch data at its input responsive to a clock signal and to source an output signal related to the data latched;
the latch further comprising a reset/set input to receive a reset/set signal to clear/set the data latched;
a buffer chain disposed serially between an output of the latch and a clock input of the latch and operable to propagate the signal sourced by the latch;
the buffer chain comprising an intermediate node to source a reset/set signal to the reset/set input of the latch;
measurement means for determining an oscillation frequency associated with the latch and the buffer; and
grading means for grading product dependent on the oscillation frequency determined by the measurement means.

17. The circuit of claim 16, the grading means comprising at least one handler of the group consisting of a wafer handler, die handler, chip handler, and integrated circuit handler.

18. The circuit of claim 17, further comprising:
database means for retaining data related to the frequency of oscillation determined by the measurement means; and
a handler controller to control the at least one handler of the grading means dependent on the data of the database means.

* * * * *